United States Patent [19]

Yoshida et al.

[11] Patent Number: 4,492,974

[45] Date of Patent: Jan. 8, 1985

[54] DMOS WITH GATE PROTECTION DIODE FORMED OVER BASE REGION

[75] Inventors: Isao Yoshida; Takeaki Okabe, both of Nishitama; Mineo Katsueda, Hachioji; Minoru Nagata, Kodaira; Toshiaki Masuhara, Nishitama; Kazutoshi Ashikawa; Hideaki Kato, both of Takasaki; Mitsuo Ito, Gunma; Shigeo Ohtaka, Takasaki; Osamu Minato, Kodaira; Yoshio Sakai, Hachioji, all of Japan

[73] Assignee: Hitachi, Ltd., Tokyo, Japan

[21] Appl. No.: 350,589

[22] Filed: Feb. 22, 1982

[30] Foreign Application Priority Data

Feb. 27, 1981 [JP] Japan ................. 56-26797

[51] Int. Cl.³ .................. H01L 29/78; H01L 29/90; H01L 27/02; H02H 3/20
[52] U.S. Cl. ........................... 357/23; 357/13; 357/41; 361/91
[58] Field of Search ............ 357/23.13, 13, 41; 361/91

[56] References Cited

U.S. PATENT DOCUMENTS

| | | | |
|---|---|---|---|
| 3,728,591 | 4/1979 | Sunshine | 357/41 |
| 3,806,773 | 4/1974 | Watanabe | 357/23.13 |
| 4,062,039 | 12/1977 | Nishimura | 357/13 |
| 4,072,975 | 2/1978 | Ishitani | 357/23.13 |

FOREIGN PATENT DOCUMENTS

| | | | |
|---|---|---|---|
| 2215850 | 2/1973 | Fed. Rep. of Germany | 357/23.13 |
| 54-140881 | 11/1979 | Japan | 357/23.13 |

*Primary Examiner*—Andrew J. James
*Assistant Examiner*—John LaMont
*Attorney, Agent, or Firm*—Antonelli, Terry & Wands

[57] ABSTRACT

A semiconductor integrated circuit device is provided to include a vertical type MOSFET and a gate protection element for the MOSFET. The vertical type MOSFET is made up of a silicon layer of n-type conductivity formed on an n+-type silicon substrate, a base region of p-type conductivity formed in the surface of the silicon layer of n-type conductivity, an n+-type source region provided in the base region, and a gate electrode formed on a portion of the base region through a gate insulating film. The silicon substrate serves as the drain. The gate protection element is formed of a polycrystalline silicon layer which is provided on the base region through an insulating film and includes at least one pn junction. By virtue of forming the gate protection element over the base region rather than directly over the substrate, a more stable operation is achieved.

15 Claims, 15 Drawing Figures

DMOS WITH GATE PROTECTION DIODE FORMED OVER BASE REGION

The present invention relates to a semiconductor integrated circuit device including a semiconductor element such as an insulated-gate field effect transistor (hereinafter referred to as an "MOSFET"), and more particularly to a semiconductor integrated circuit device including, for example, an MOSFET and a semiconductor element connected to an input (e.g. gate) terminal or an output terminal of the MOSFET for protecting the MOSFET against an external surge voltage and the like.

A protection diode which is formed in the same semiconductor substrate as an MOSFET, has hiterto been used as, for example, a gate protection element for the MOSFET. Accordingly, in a vertical type MOSFET in which a semiconductor substrate acts as a drain region, it is a concern that the MOSFET may be damaged by a thyristor action due to a parasitic transistor. Thus, the protection diode formed in the substrate raises a serious problem when put to practical use. In order to solve this problem, a structure has been proposed wherein a protection element of this sort is provided on an insulating film separated from a semiconductor substrate which constitutes a MOSFET. This is shown in U.S. Pat. No. 4,261,004 and a German Patent application (Laid-open No. 2834759). Further, this protection element has an $n^+-i-n^{30}$ ($p^+i-p^+$) or $n^+-\pi-n^+(p^+-\nu-p^+)$ structure that a pair of highly doped regions are formed in an intrinsic or almost intrinsic polycrystalline silicon layer so as to sandwich a portion of the intrinsic polycrystalline silicon layer therebetween, and thus the breakdown voltage of the protection element is determined by the punch-through voltage between the highly doped regions. However, a gate protection element of this type has such drawbacks as mentioned below. The breakdown voltage of the element is greatly dependent upon the processing accuracy, as is evident from the operation principle of the punch-through element, and therefore the absolute value of breakdown voltage varies widely. Moreover, the element is low in strength against destruction.

It is an object of the present invention to provide a semiconductor integrated circuit device having a protection element whose breakdown voltage is scarcely affected by the processing accuracy and therefore varies only in a small range, and which can be fabricated with a high yield.

It is another object of the present invention to provide a semiconductor integrated circuit device having a protection element which is high in strength against destruction.

In order to attain the above objects, in a semiconductor integrated circuit device according to the present invention, a protection element provided on an insulating film is operated on the basis of the breakdown of a pn junction. In more detail, a protection element according to the present invention is formed in a semiconductor layer (for example, a polycrystalline silicon layer) which is provided on an insulating film formed on a semiconductor body (e.g. silicon substrate), and includes a pair of highly doped regions (at which the number of impurity atoms per unit area is not less than $10^{15}$ cm$^{-2}$) and a low doped region sandwiched between the highly doped regions for forming a pn junction with at least one of the highly doped regions. At the low doped region, the number of impurity atoms per unit area lies in a range from $10^{13}$ to $10^{15}$ cm$^{-2}$. Further, the above-mentioned protection element can be used as a unit element and a plurality of such protection units can be connected in series to obtain a protection element having a desired breakdown voltage.

Further, according to one aspect of the present invention, a region which is provided in a surface region of the semiconductor body and underlies the protection element, can be fixed to a constant potential (for example, ground potential) in order that the protection element can perform a stable operation.

The present invention will be apparent from the following detailed description taken in conjunction with the accompanying drawings, in which.

Figure 1A:
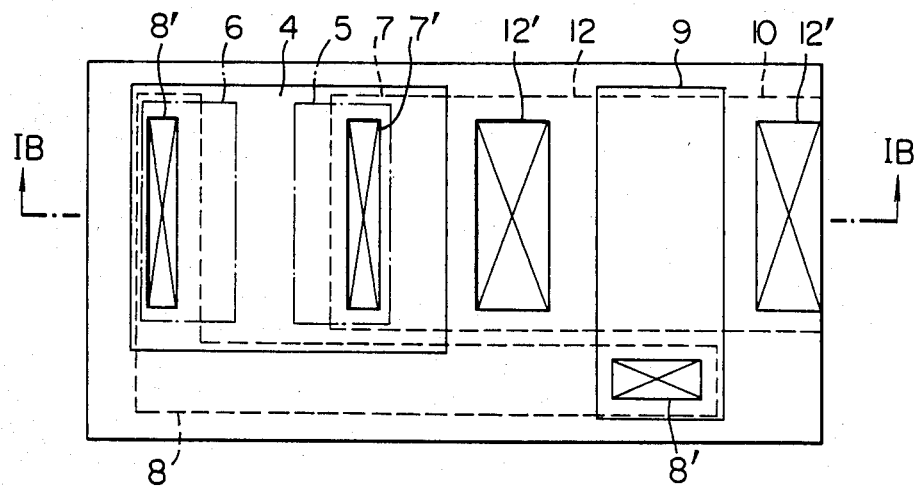
FIG. 1A is a plan view showing a first embodiment of a semiconductor integrated circuit device according to the present invention.

Now, explanation will be made on embodiments of the present invention, with reference to the drawings.

In the drawings, reference numeral 1 designates a semiconductor layer (made of silicon, etc.) of n-type conductivity, 2 a gate insulating film (made of SiO$_2$, etc.) of an MOSFET, 3 a field insulating film (made of SiO$_2$, etc.), 4 a semiconductor layer (made of polycrystalline silicon, etc.) of p-type conductivity, 5 and 6 semiconductor layers (made of polycrystalline silicon, etc.) of n-type conductivity, 7 and 8 aluminum electrodes, 9 a gate electrode (made of polycrystalline silicon, etc.), 10 a p-type region including a portion 10' for inducing a channel, 11 a source region of n-type conductivity, 12 a source electrode, 13 a semiconductor substrate (for example, a highly doped silicon substrate) of n-type conductivity, 14 a drain electrode, 15 a passivation film, 16, 17 and 18 protection elements according to a feature of the present invention, 19 and 20 current-voltage characteristic curves, 21 and 24 characteristic curves of conventional protection elements, 22, 23, 25, 26 and 27 characteristic curves of protection elements according to a feature of the present invention, 28 a memory circuit of an integrated circuit device to be protected, 29 another circuit of the integrated circuit device to be protected, 30 and 31 MOSFET's, 32 and 33 resistors made of polycrystalline silicon, 34 an external terminal, 35, 36 and 37 integrated circuits to be protected, 38, 39 and 40 protection elements according to a feature of the present invention, 41 a semiconductor layer (made of polycrystalline silicon, etc.) of p-type conductivity, and 42 a protection element according to a feature of the present invention.

EMBODIMENT 1

Figure 1B:
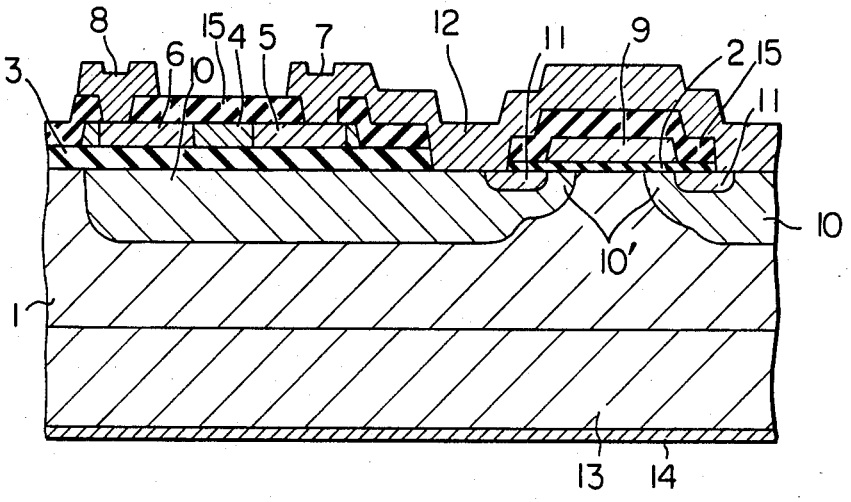
FIG. 1B is a sectional view of the first embodiment, taken along the line IB—IB in FIG. 1A.
Figure 1C:
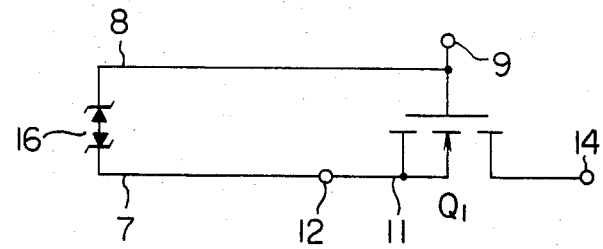
FIG. 1C shows an equivalent circuit diagram of the first embodiment shown in FIGS. 1A and 1B.

FIGS. 1A, 1B and 1C show a portion of an embodiment of a semiconductor integrated circuit device according to the present invention, wherein FIG. 1A is a plan view of a vertical MOSFET and a gate protection element connected thereto, FIG. 1B is a sectional view of these elements taken along the line IB—IB in FIG. 1A, and FIG. 1C shows an equivalent circuit of these elements. Now, the structure of the present embodiment will be explained with reference to FIGS. 1A, 1B and 1C. A semiconductor layer 1 of n-type conductivity is made of silicon or other materials, and has a resistivity of 20 Ω·cm and a thickness of 35 μm. A gate insulating film 2 of an MOSFET is made of $SiO_2$ or other materials, and has a thickness of 130 nm. A field insulating film 3 is made of $SiO_2$ or other materials, and has a thickness of 0.6 μm (=600 nm). A polycrystalline semiconductor layer 4 is made of silicon or other materials, is doped with an impurity of, for example, p-type conductivity, and has a thickness of 0.4 μm. A highly doped polycrystalline semiconductor layer 5 of n-type conductivity is made of silicon or other materials, and is connected to an electrode 7. A highly doped polycrystalline semiconductor layer 6 of n-type conductivity is made of silicon or other materials, and is connected to an electrode 8. A p-type conductivity region 10 has a sheet resistivity of 1 kΩ/◻, and is 10 μm deep. A gate electrode 9 of the MOSFET, a source region 11 of n-type conductivity, a source electrode 12, a silicon substrate 13 of n-type conductivity, and a drain electrode 14 are provided as shown in FIGS. 1A and 1B. Further, a portion 10' of the p-type region forms the channel of the MOSFET. The MOSFET and a gate protection element which are made up of the above-mentioned parts or members, correspond respectively to an MOSFET and polycrystalline silicon diodes shown in FIG. 1C, and make up a circuit shown in FIG. 1C, that is, a circuit in which a protection diode 16 is connected to a vertical MOSFET $Q_1$. The vertical MOSFET $Q_1$ is made up of the highly doped source region 11 of n-type conductivity, the base region 10 of p-type conductivity, the gate electrode 9 (made of polycrystalline silicon), the semiconductor layer 1 of n-type conductivity, and the highly doped semiconductor substrate 13 of n-type conductivity. The protection diode 16 prevents an excess external surge voltage from being applied to the gate terminal (namely, the gate electrode) 9 of the MOSFET $Q_1$.

Further, the protection diode 16 has the advantages of having a current-voltage characteristic which does not restrict the operating area of a device to be protected, and of being high in strength against destruction.

The breakdown voltage of the diode 16 is determined by the impurity concentration in the semiconductor layer 4. In more detail, when the number of impurity atoms per unit area at the layer 4 is less than $1 \times 10^{13}$ $cm^{-2}$, the maximum current against destruction of the diode 16 is very small since the breakdown voltage between the layer 5 and layer 6 is based upon the punch-through phenomenon, and therefore such a doping range cannot be employed for practical use. On the other hand, when the number of impurity atoms per unit area is more than $1 \times 10^{15} cm^{-2}$, the breakdown voltage between the layer 5 and layer 6 is decreased, and the leakage current flowing through the diode is increased. Thus, such a doping range cannot be used for practical purpose. Accordingly, the number of impurity atoms per unit area of the semiconductor layer 4 lies in a range from $1 \times 10^{13}$ to $1 \times 10^{15}$ $cm^{-2}$. When the layer 4 is a polycrystalline semiconductor layer, the impurity concentration in the semiconductor layer 4 lies within a range from $10^{17}$ to $10^{19} cm^{-3}$. The thickness of the layer 4 is preferably in a range of 0.1 to 1 μm. For example, in the case where the layer 4 in the present embodiment was 0.4 μm thick and doped with boron to form a p-type region, and the number of boron atoms per unit area was equal to $5 \times 10^{13}$ $cm^{-2}$ (that is, the impurity concentration in the p-type region 4 was equal to $1.25 \times 10^{18} cm^{-3}$), the protection diode 16 had a breakdown voltage of 18V, and had a strength against destruction of more than 700V for an electrostatic surge from a 200 pF capacitor. In this case, the number of impurity atoms per unit area in the $n^+$-type layers or regions 5 and 6 was made greater than $1 \times 10^{15}$ $cm^{-2}$ (that is, the impurity concentration in the regions 5 and 6 was made greater than $2.5 \times 10^{19} cm^{-3}$).

The polycrystalline p-type region is preferably formed by ion-implanting p-type impurities into a polycrystalline layer at a dose of $1 \times 10^{13}$ to $1 \times 10^{15}$ atoms·$cm^{-2}$. Here, ion-implantation is advantageous over diffusion in respects of accurately forming a uniformly doped region at a desired location. The heavily doped polycrystalline regions 5 and 6 having a higher impurity concentration than the intermediate region 4 may be formed by diffusion or ion-implanation. Diffusion may be preferred for easily forming a very heavily doped region. A step-like pn junction (s) can be formed in a thin polycrystalline layer by either method.

The breakdown of the pn junction may be ascibed to avalanche and/or Zener (tunnelling) breakdown. In other words, the $n^+pn^+$ structure has such a high impurity concentration that breakdown occurs in a reversely biased pn junction before the intermediate p-type region is punched through by the development of the depletion layer.

EMBODIMENT 2

Figure 2A:
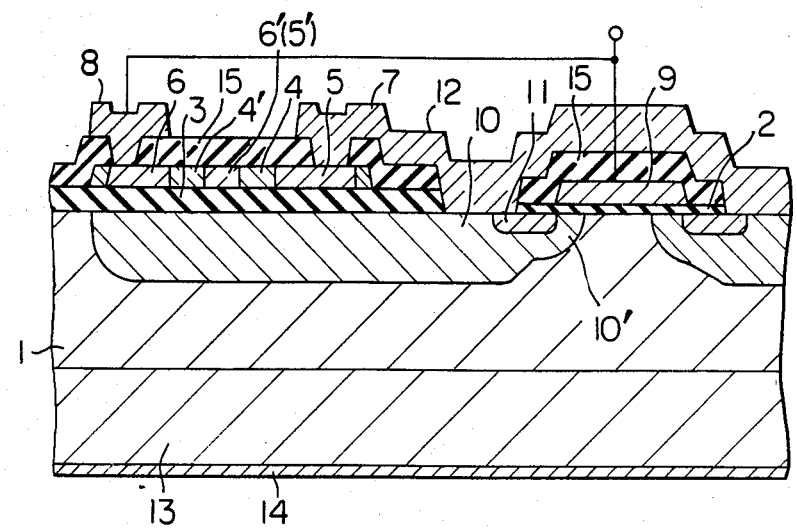
FIG. 2A is a sectional view showing a second embodiment of a semiconductor integrated circuit device according to the present invention.
Figure 2B:
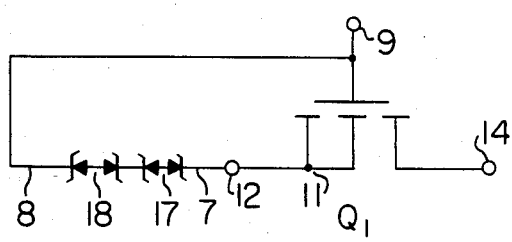
FIG. 2B shows an equivalent circuit diagram of the second embodiment shown in FIG. 2A.

FIGS. 2A and 2B show a portion of another embodiment of a semiconductor integrated circuit device according to the present invention. FIG. 2A is a sectional view of a vertical MOSFET and a gate protection element connected thereto, and FIG. 2B shows an equivalent circuit of the elements shown in FIG. 2A. In this embodiment, the gate protection diode is made up of a diode 17 which has an $n^+-p-n^+$ structure and is formed of semiconductor layers 5, 4 and 6', and another diode 18 which has an $n^+-p-n^+$ structure and is formed of semiconductor layers 5', 4' and 6. In this case, the breakdown voltage of the gate protection element is equal to the sum of the breakdown voltage of the diode 17 and that of the diode 18. As is apparent from FIG. 2A, the present embodiment is characterized by employing a plurality of pn junctions connected in series, each pn junction being formed of a polycrystalline silicon layer doped with p-type impurity and a polycrystalline silicon layer doped with n-type impurity. When a plurality of pn junctions are connected in series, a plurality of separate polycrystalline silicon layers (including pn junctions) may be connected in series through electrodes to obtain a satisfactory result.

Next, explanation will be made on electrical characteristics of the devices as obtained in the EMBODIMENTS 1 and 2.

Figure 3:
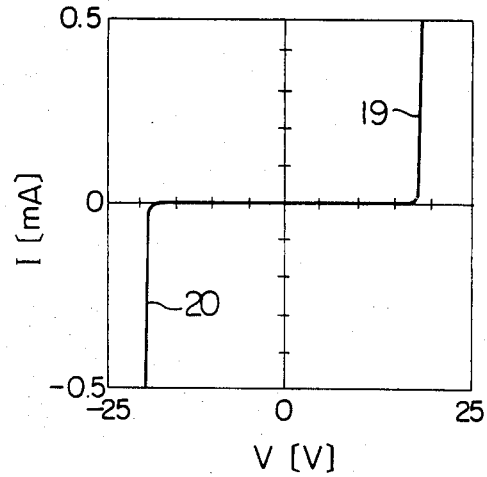
FIG. 3 is a graph showing a current-voltage (I-V) characteristic of a protection element included in a semiconductor integrated circuit device according to an embodiment of the present invention.

FIG. 3 shows a current-voltage characteristic between the gate electrode 9 and source region 11 shown in FIGS. 1A, 1B and 1C. As is apparent from FIG. 3, a forward current characteristic curve 19 and a reverse current characteristic curve 20 are almost symmetrical with respect to the origin, and the breakdown voltave is about ±18V.

Figure 4:
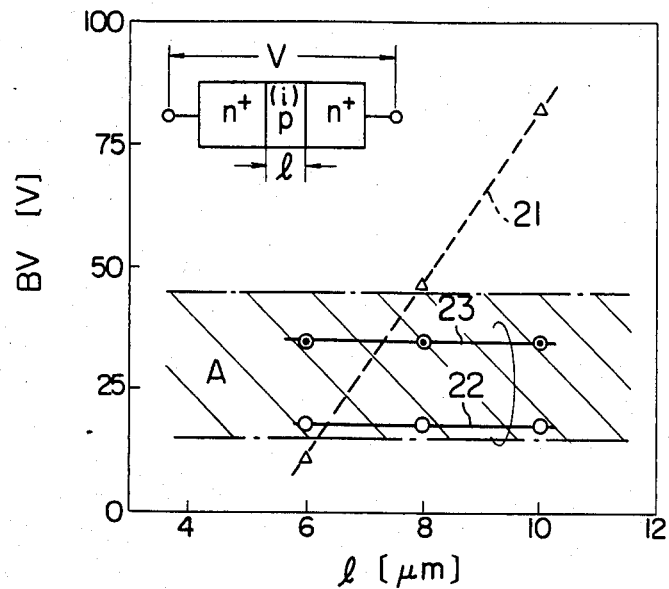
FIG. 4 is a view showing the dependency of breakdown voltage BV on dimension l of the protection element according to a feature of the present invention compared to the conventional protection element.

FIG. 4 shows the dependence of breakdown voltage BV on dimension l in $n^+-p-p^+$ diodes according to an embodiment of this invention, compared to that in $n^+-i-n^+$ conventional diodes. A practical range of breakdown voltage which is required for a gate protection element, is indicated by a hatched area in FIG. 4, by way of example. A lower limit of this range is determined by an operating gate voltage of an MOSFET, and an upper limit of the range is determined by a gate protection voltage. Accordingly, these limits depend upon the usage how a device to be protected operates. Referring to FIG. 4, in the conventional diodes, the dependence of breakdown voltage on dimension is high, i.e. expressed by a value of 20V/$\mu$m, as indicated by a characteristic curve 21. Accordingly, a conventional diode is required to have a value of l within a narrow range, and the breakdown voltage of conventional diodes varies widely. On the other hand, the breakdown voltage of the diodes according to the present invention, is constant independently of the dimension l, as indicated by characteristic curves 22 and 23 in FIG. 4. Here, the length l is preferably longer than about 1 $\mu$m for ensuring the breakdown of the pn junction before punch-through. The diodes according to the embodiments of the present invention are fabricated in a high yield. Incidentally, the curves 22 and 23 show the characteristic of protection diodes having the structure shown in FIGS. 1A, 1B and 1C and the characteristic of protection diodes having the structure shown in FIGS. 2A and 2B, respectively.

Figure 5:
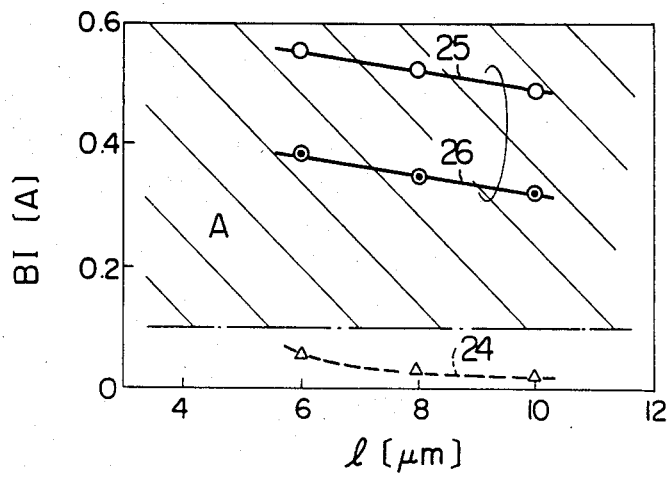
FIG. 5 is a view showing the dependency of maximum current against destruction BI on dimension l of the protection element according to a feature of the present invention compared to that of the conventional protection element.

FIG. 5 shows the dependence of maximum current against destruction BI on dimension l based upon experiments in which the maximum current against destruction BI was measured with a curve tracer. Referring to FIG. 5, the above current BI of the conventional diodes is very small, as indicated by a curve 24. In other words, the conventional diodes are readily broken. On the other hand, diodes according to an embodiment of the present invention have the maximum current against destruction of more than 0.3A, as indicated by curves 25 and 26 in FIG. 5, and therefore can be put to practical use.

Figure 6:
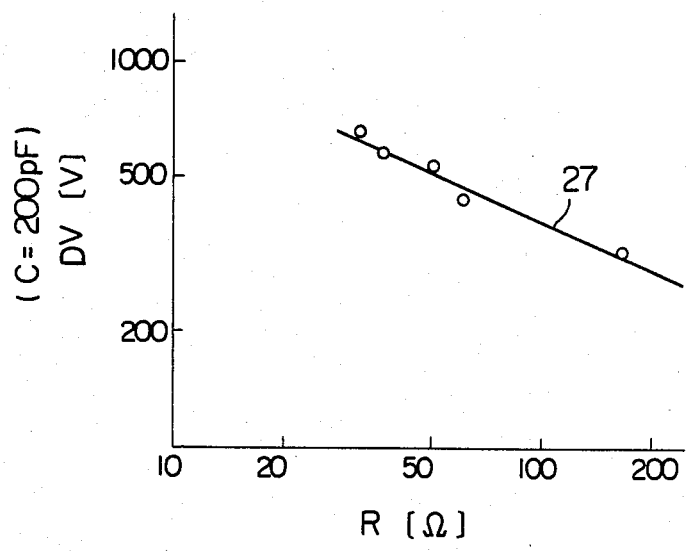
FIG. 6 is a graph showing a relation between the minimum voltage for causing surge destruction DV and the resistance after the breakdown R of the protection diode according to a feature of the invention.

Further, there will be shown below the result of experiments on the protection effect of a protection diode on a main device. FIG. 6 shows a relation between the minimum surge destruction voltage DV which is charged in a capacitor of 200 pF and applied to the parallel connection of the main device and the protection unit, and the resistance R of the protection diode after the breakdown. As is apparent from FIG. 6, the above-mentioned voltage DV is higher as the resistance R is smaller. In other words, the resistance R of the protection diode after breakdown is preferably small in order to make high the strength against surge destruction of the main device, and this requirement is satisfied by the protection diode according to the embodiment of the present invention since the resistance of the protection diode is not dominated by an intrinsic region but by a doped region.

In the EMBODIMENTS 1 and 2, the base region 10 of the vertical-type MOSFET is extended beneath the protection diode, and the base region 10 is fixed at a constant potential, for example, the ground potential. Thus, the formation of a parasitic MOSFET in which the semiconductor substrate 1 works as a gate, is prevented. That is, a protection diode according to the embodiment of the present invention is not affected by an electric potential of the semiconductor body 1, but can perform a stable operation.

EMBODIMENT 3

Figure 7:
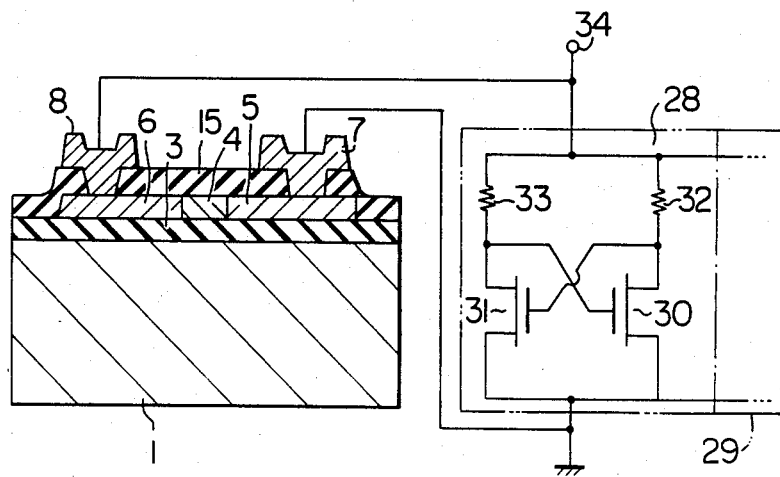
FIG. 7 is a schematic sectional view of a third embodiment of a semiconductor integrated circuit device according to the present invention.

FIG. 7 shows a portion of a further embodiment of a semiconductor integrated circuit device according to the present invention, and includes a main integrated circuit and an element for protecting the main integrated circuit. The main integrated circuit to be protected comprises a memory circuit 28, which is connected to an external terminal 34, and a different circuit 29. The protection element which is shown in section in FIG. 7, is connected between the external terminal 34 and the ground. In FIG. 7, reference numeral 1 designates a silicon layer of n-type conductivity, 3 an $SiO_2$ film having a thickness of 0.6 $\mu$m, 4 a polycrystalline silicon layer doped with a p-type impurity and having a thickness of 0.4 $\mu$m, and 5 and 6 polycrystalline silicon layers highly doped with an n-type impurity and connected respectively to aluminum electrodes 7 and 8. Although FIG. 7 includes a sectional view and a circuit diagram for the sake of explanation, the embodiment shown in FIG. 7 is formed on one silicon chip. The polycrystalline silicon layer 4 of p-type conductivity and resistors 32 and 33 are formed in the same fabrication process, and therefore the protection element can be fabricated without complicating the fabrication process of the main integrated circuit. Further, the breakdown voltage of the protection element is determined by the number of p-type impurity atoms per unit area in the layer 4, and is 25V when the number of boron atoms per unit area is $2 \times 10^{13}$ cm$^{-2}$. Owing to the presence of the protection element, the main integrated circuit is never damaged by external surge, and therefore the reliability of the main integrated circuit is greatly enhanced.

EMBODIMENT 4

Figure 8:
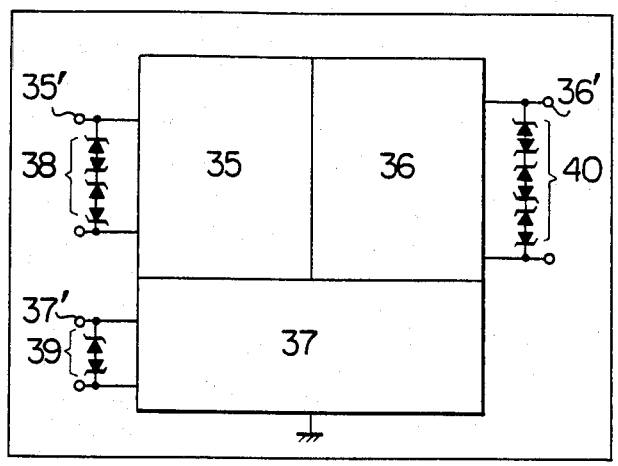
FIG. 8 is a schematic diagram for showing a fourth embodiment of a semiconductor integrated circuit device according to the present invention.

FIG. 8 is a schematic diagram showing still another embodiment of a semiconductor integrated circuit device according to the present invention, and shows a large scale integrated circuit including circuits 35, 36 and 37 which are provided respectively with protection elements 38, 39 and 40. Since the circuits 35, 36 and 37 are different in supply voltage from each other, the protection elements 38, 39 and 40 connected respectively to power supply terminals 35', 37' and 36'of the above circuits are made different in breakdown voltage from each other. In this embodiment, an element having an n+—p—n+structure is used as a unit, and protection elements having different breakdown voltages are formed by connecting a predetermined number (e.g. two or three) units in series.

Figure 9A:
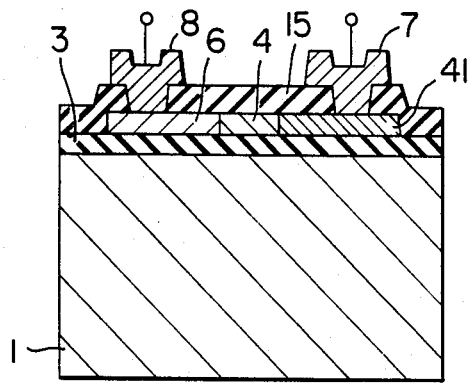
FIG. 9A is a sectional view showing a protection element having an $n^+-p-p^+$ structure.
Figure 9B:
FIGS. 9B and 9C show symbols for a protection element having an $n^{30}-p-p^+$ structure.
Figure 9C:
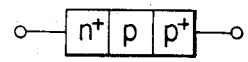

The protection elements which have been explained in the foregoing, have an n+—p—n+structure. However, the protection elements may have an n+—p—p+structure shown in FIGS. 9A, 9B and 9C. FIG. 9A shows, in section, a protection element having an n+—p—p+structure, and FIGS. 9B and 9C show symbols of the protection element shown in FIG. 9A. In FIG. 9A, reference numeral 41 designates a polycrystalline silicon layer highly doped with a p-type impurity, and other reference numerals designate similar parts as in other figures.

Figure 9D:
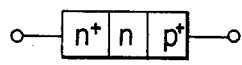
FIG. 9D shows a symbol for a protection element having an $n^+-n-p^+$ structure.

FIG. 9D shows an n+—n—p+which can also be used in the present invention.

As explained in the foregoing, the protection semiconductor element according to the embodiments of the present invention is very effective in preventing electrostatic damage to the gate insulating film of MOSFET and in preventing an integrated circuit and a large scale integrated circuit from being damaged by external surge. Further, variations in the breakdown voltage of the protection semiconductor element are negligible, and therefore the element can be fabricated in a high yield.

It is to be understood that the present invention is not limited to the above-mentioned embodiments but many variations and modifications can be made without departing from the spirit and scope of the present invention.

We claim:

1. A semiconductor integrated circuit device comprising:
   a semiconductor body;
   a semiconductor element formed in said semiconductor body;
   a semiconductor region formed in a surface region of said semiconductor body and having an opposite conductivity type to that of said semiconductor body; and
   a protection element for protecting said semiconductor element, said protection element being formed in a semiconductor layer provided on an insulating film situated on said semiconductor region, said protection element including a pair of highly doped regions and a low doped region in such a manner that said low doped region is sandwiched between said highly doped regions and that a pn junction is formed between said low doped region and at least one of said highly doped regions, the number of impurity atoms per unit area at said low doped region being in a range from $10^{13}$ to $10^{15}$ cm$^{-2}$, and the thickness of said low doped region being in a range from 0.1 to 1 $\mu$m.

2. A semiconductor integrated circuit device according to claim 1, wherein said semiconductor element is an MOSFET, and the gate and the source of said MOSFET are connected to one of said highly doped regions and the other of said highly doped regions, respectively.

3. A semiconductor integrated circuit device according to claim 2, wherein said MOSFET is a vertical type MOSFET.

4. A semiconductor integrated circuit device according to claim 1, 2 or 3, wherein said highly doped regions are equal in conductivity type, and said low doped region is opposite in conductivity type to said highly doped regions.

5. A semiconductor integrated circuit device according to claim 1, 2 or 3, wherein said highly doped regions are opposite in conductivity type to each other, and said low doped region is equal in conductivity type to one of said highly doped regions.

6. A semiconductor integrated circuit device according to claim 1, wherein said semiconductor layer is made of a polycrystalline semiconductor material.

7. A semiconductor integrated circuit device comprising:
   a semiconductor body;
   a semiconductor element formed in said semiconductor body;
   a semiconductor region formed in a surface region of said semiconductor body and having an opposite conductivity type to that of said semiconductor body; and
   a protection element for protecting said semiconductor element, said protection element being formed in a semiconductor layer provided on an insulating film situated on said semiconductor region, said protection element including a pair of highly doped regions and a low doped region in such a manner that said low doped region is sandwiched between said highly doped regions and that a pn junction is formed between said low doped region and at least one of said highly doped regions, the impurity concentration of said low doped region being in a range from $10^{17}$ to $10^{19}$ cm$^{-3}$.

8. A semiconductor integrated circuit device according to claim 7, wherein said semiconductor element is an MOSFET, and the gate and the source of said MOSFET are connected to one of said highly doped regions and the other of said highly doped regions, respectively.

9. A semiconductor integrated circuit device according to claim 8, wherein said MOSFET is a vertical type MOSFET.

10. A semiconductor integrated circuit device according to claim 7, 8 or 9, wherein said highly doped regions are equal in conductivity type, and said low doped region is opposite in conductivity type to said highly doped regions.

11. A semiconductor integrated circuit device according to claim 7, 8 or 9, wherein said highly doped regions are opposite in conductivity type to each other, and said low doped region is equal in conductivity type to one of said highly doped regions.

12. A semiconductor integrated circuit device according to claim 7, wherein said semiconductor layer is made of a polycrystalline semiconductor material.

13. A semiconductor integrated circuit device according to claim 1 or 7, further comprising means for fixing said semiconductor region at a constant potential.

14. A semiconductor integrated circuit device according to claim 13, wherein said semiconductor region is fixed at ground potential.

15. A semiconductor integrated circuit device according to claim 1 or 7, wherein said semiconductor region is located in said semiconductor body relative to said protection element so that said entire protection element is formed over said semiconductor region.

* * * * *